(12) United States Patent
Suzuki et al.

(10) Patent No.: US 7,557,429 B2
(45) Date of Patent: Jul. 7, 2009

(54) SEMICONDUCTOR DEVICE WITH RESISTOR ELEMENT AND DUMMY ACTIVE REGION

(75) Inventors: Kaina Suzuki, Kawasaki (JP); Shigeo Satoh, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 62 days.

(21) Appl. No.: 10/950,451

(22) Filed: Sep. 28, 2004

(65) Prior Publication Data

US 2005/0287756 A1    Dec. 29, 2005

(30) Foreign Application Priority Data

Jun. 28, 2004   (JP)   ............... 2004-190030

(51) Int. Cl.
*H01L 23/58* (2006.01)
(52) U.S. Cl. ............... 257/536; 257/E21.004; 257/537
(58) Field of Classification Search ......... 257/536, 257/E21.004, 541, 537
See application file for complete search history.

(56) References Cited

U.S. PATENT DOCUMENTS

| 5,668,755 | A | * | 9/1997 | Hidaka .................. 365/182 |
| 6,069,391 | A | * | 5/2000 | Yuzuriha .................. 257/374 |
| 6,078,094 | A | * | 6/2000 | Poplevine et al. .......... 257/536 |
| 2002/0057187 | A1 | * | 5/2002 | Sanfilippo et al. ......... 338/20 |

FOREIGN PATENT DOCUMENTS

JP    11-238807    8/1999

* cited by examiner

*Primary Examiner*—Thanh V Pham
*Assistant Examiner*—Mohammad T Karimy
(74) *Attorney, Agent, or Firm*—Westerman, Hattori, Daniels & Adrian, LLP.

(57) ABSTRACT

A first well is formed in the surface layer of a semiconductor substrate, the first layer being of a first conductivity type, the first well being of a second conductivity type opposite to the first conductivity type. A pair of current input/output ports are connected to the first well, the pair of current input/output ports being used for flowing current through the first well along the direction parallel to a substrate surface. A second well of the first conductivity type is disposed between the pair of current input/output ports, the second well being shallower than the first well. A resistor element is provided which facilitates to have a desired resistance value.

9 Claims, 8 Drawing Sheets

FIG.7

SEMICONDUCTOR DEVICE WITH RESISTOR ELEMENT AND DUMMY ACTIVE REGION

CROSS REFERENCE TO RELATED APPLICATION

This application is based on and claims priority of Japanese Patent Application No. 2004-190030 filed on Jun. 28, 2004, the entire contents of which are incorporated herein by reference.

BACKGROUND OF THE INVENTION

A) Field of the Invention

The present invention relates to a semiconductor device having a resistor element and its manufacture method, and more particularly to a semiconductor device using as a resistor element an impurity diffusion region formed in a surface layer of a semiconductor substrate.

B) Description of the Related Art

Resistor elements are used in a semiconductor integrated circuit. For example, in an input/output circuit, a protective circuit is constituted of a MOS type field effect transistor and a resistor in order to protect internal circuits from electrostatic breakdown. A semiconductor integrated circuit generally uses a conductive film resistor element made of polysilicon or the like formed at the same time when the gate electrode of a field effect transistor is formed or a diffusion layer resistor element formed at the same time when the source and drain regions of a field effect transistor are formed. The resistances of the gate electrode, source and drain diffusion layers are preferably set low from the viewpoint of the performance of a field effect transistor. From this reason, the conductive film formed at the same time when the gate electrode is formed and the diffusion layer formed at the same time when the source and drain regions are formed are not suitable for forming a high resistance element.

Japanese Patent Laid-open Publication No. HEI-11-238807 discloses a method of realizing a high resistance element by utilizing the well just under an element isolation insulating film of a shallow trench isolation (STI) structure.

Figure 5:
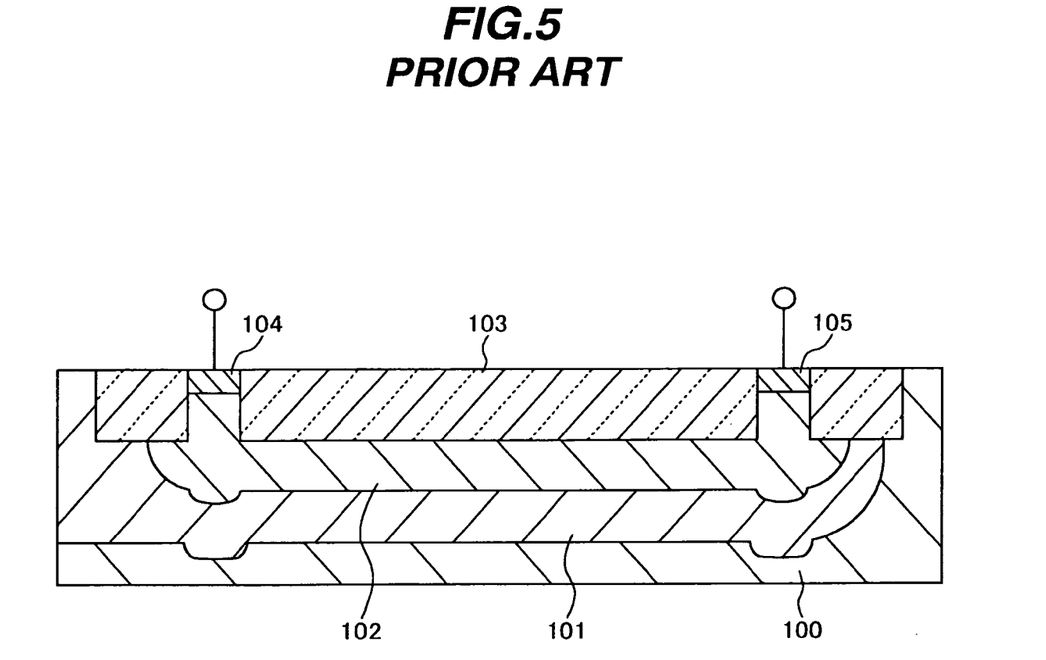
FIG. 5 is a cross sectional view of a conventional semiconductor device.

FIG. 5 is a cross sectional view of a resistor element disclosed in Japanese Patent Laid-open Publication No. HEI-11-238807. An n-type well 101 is formed in a surface layer of a p-type silicon substrate 100. A p-type well 102 is formed in the n-type well 101. The p-type well 102 is formed at the same time when a p-type well is formed in which an NMOS transistor is to be disposed. An element isolation insulation film 103 is formed on the substrate surface, and active regions are defined in different areas of the surface layer of the p-type well 102. In the surface layers of the two active regions, p-type diffusion regions 104 and 105 are formed. The p-type well 102 constitutes a resistor element having the p-type diffusion regions as current input/output ports.

A method of forming the resistor element shown in FIG. 5 will be briefly described. A mask pattern of silicon nitride or the like is formed on the silicon substrate 100. By using the mask pattern as an etching mask, the silicon substrate 100 is etched to form a shallow trench. A silicon oxide film is deposited on the silicon substrate 100, the silicon oxide film being filled in the shallow trench.

This silicon oxide film is subjected to chemical mechanical polishing (CMP) to expose the mask pattern. Silicon oxide left in the shallow trench constitutes the element isolation insulating film 103. The exposed mask pattern is removed and thereafter ion implantation processes are executed to form the n-type well 101, p-type well 102 and p-type diffusion layers 104 and 105.

As the area where the element isolation insulating film 103 becomes broad, the flatness of the surface after CMP is degraded because of a polishing speed difference between silicon oxide and silicon nitride. In order to prevent the flatness from being degraded, a dummy active regions are disposed in the region of the element isolation insulating film 103. These dummy regions are automatically designed by CAD when patterns are designed.

Figure 6:
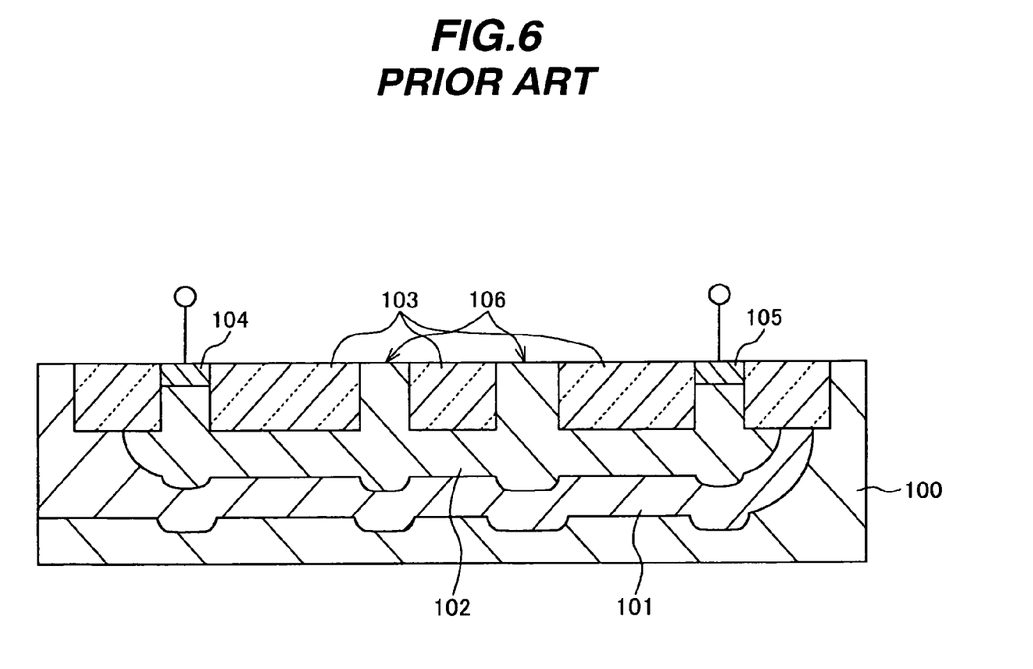
FIG. 6 is a cross sectional view of a conventional semiconductor device.

FIG. 6 is a cross sectional view of a resistor element with dummy active regions 106. A plurality of dummy regions 106 are disposed in a p-type well 102.

In the ion implantation process of forming wells, impurity ions are implanted through the element isolation insulating film 103 into the regions just under the element isolation insulating film 103. The depth of the well is deeper in the active regions 106 than in the regions just under the element isolation insulating film 103, because of the influence of channeling.

Figure 7:
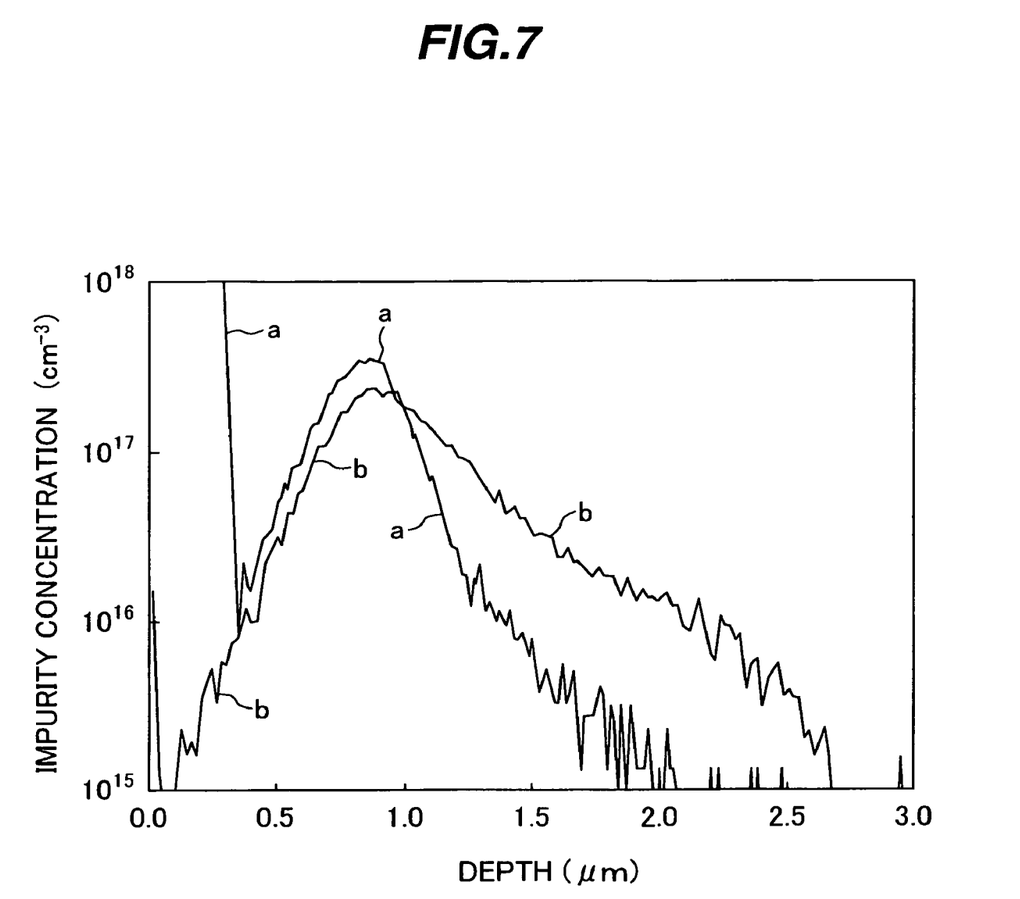
FIG. 7 is a graph showing an impurity concentration distribution along a depth direction in an impurity diffusion region formed by ion implantation.

FIG. 7 is a graph showing an example of an impurity concentration distribution along a depth direction. The abscissa represents a position along the depth direction in the unit of "μm" and the ordinate represents an impurity concentration in the unit of "cm$^{-3}$". A solid line a indicates the impurity concentration distribution in the region where the element isolation insulating film is formed, and a solid line b indicates the impurity concentration distribution in the active region. The position at a depth of about 0.04 μm corresponds to the surface of the active region, and the position at a depth of about 0.3 μm corresponds to the interface between the element isolation insulating film and silicon substrate. It can be seen that impurities reach a deeper position in the active regions than in the regions just under the active regions.

The p-type well 102 in the active region 106 becomes deeper than the p-type well 102 just under the element isolation insulating film 103, by an amount corresponding to the thickness of the element isolation insulating film 103 and an increase in the depth by the channeling effect. Therefore, the resistance value of the resistor element having the p-type diffusion layers 104 and 105 as its opposite terminals becomes lower than that intended by a designer. Since regions having different thicknesses are mixed, a circuit layout design aiming to obtain a desired resistance value becomes complicated.

SUMMARY OF THE INVENTION

According to one aspect of the present invention, there is provided a semiconductor device comprising: a first well formed in a surface layer of a semiconductor substrate, the first layer being of a first conductivity type, the first well being of a second conductivity type opposite to the first conductivity type; a pair of current input/output ports connected to the first well, the pair of current input/output ports being used for flowing current through the first well along a direction parallel to a substrate surface; and a second well of the first conductivity type disposed between the pair of current input/output ports, the second well being shallower than the first well.

According to another aspect of the present invention, there is provided a method of manufacturing a semiconductor device, that comprises: a first well formed in a surface layer of a semiconductor substrate, the surface layer being of a first conductivity type, the first well being of a second conductivity type opposite to the first conductivity type; a pair of current input/output ports connected to the first well, the pair of current input/output ports being used for flowing current through the first well along a direction parallel to a substrate surface; and a second well of the first conductivity type disposed between the pair of current input/output ports, the second well being shallower than the first well, the method comprising steps of: (a) forming a mask pattern on a surface of the semiconductor substrate, the mask pattern covering an area corresponding to a region where the active region is to be formed; (b) by using the mask pattern as an etching mask, etching a surface layer of the semiconductor substrate to form a shallow trench; (c) filling an insulating film in the shallow trench and depositing the insulating film on the mask pattern; (d) polishing the insulating film until the mask pattern is exposed to form an element isolation insulating film by leaving a portion of the insulating film in the shallow trench; (e) implanting ions to form the first and second wells; and (f) after ion implantation, removing the mask pattern.

The region of the second conductivity type between the bottom of the second well and the bottom of the first well functions as a resistor element. Since current will not flow in the surface layer of the substrate, the resistance value of the resistor element will not be influenced by the layout of the element isolation insulating film and active region in the substrate surface layer.

Since ion implantation for forming the first and second wells is performed under the condition that the mask pattern is left, the channeling phenomenon can be suppressed in the region where the element isolation insulating film is not formed.

DESCRIPTION OF THE PREFERRED EMBODIMENTS

Figure 1A:
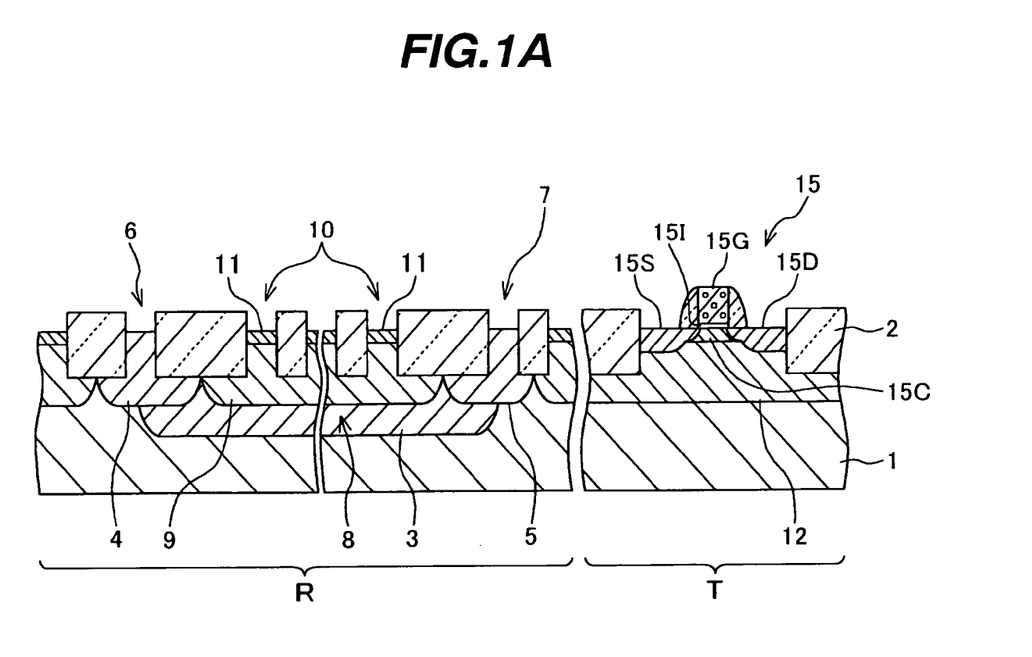
FIG. 1A is a cross sectional view of a semiconductor device according to a first embodiment.
Figure 1B:
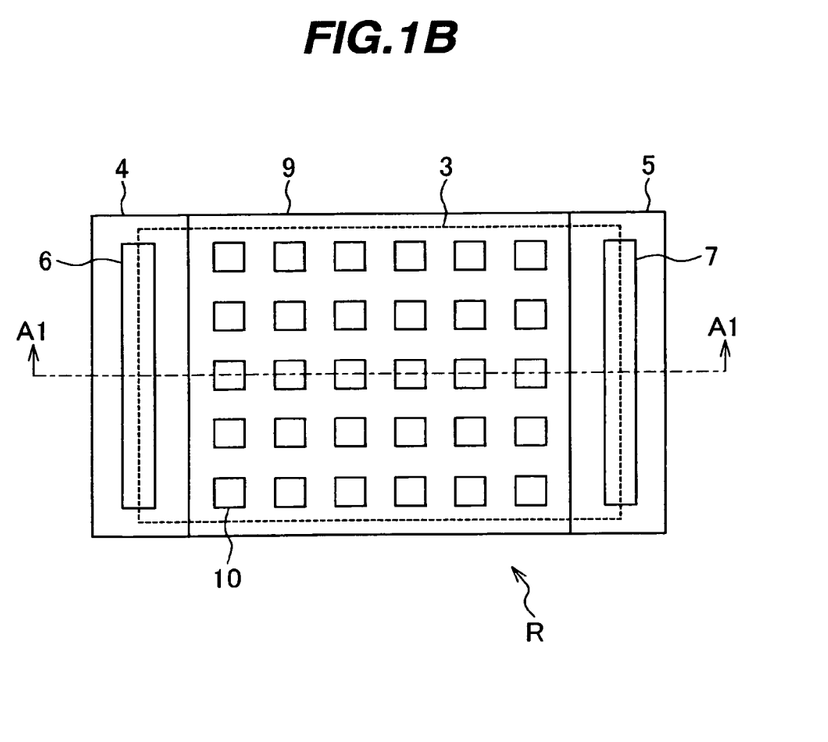
FIG. 1B is a plan view showing a resistance element region of the semiconductor device of the first embodiment.

FIG. 1A is a cross sectional view of a semiconductor device according to the first embodiment. A resistor element region R and a transistor region T are defined in a semiconductor substrate 1. FIG. 1B is a plan view of the resistor element region R shown in FIG. 1A. A cross sectional view taken along one-dot chain line A1-A1 of FIG. 1B corresponds to the resistor element region R shown in FIG. 1.

As shown in FIG. 1A, an element isolation insulating film 2 of an STI structure is formed on the surface of a semiconductor substrate 1 made of p-type silicon, the element isolation insulating film defining a plurality of active regions. In a surface layer of the semiconductor substrate 1, a deep n-type well 3 is formed. Current input/output ports 4 and 5 constituted of n-type impurity diffusion regions are formed on opposite sides of the deep well 3. The current input/output ports 4 and 5 partially overlap the deep well 3 and are in ohmic contact with the deep well 3. Active regions 6 and 7 are disposed in the surface layers of the current input/output ports 4 and 5.

A p-type shallow well 9 is formed between the current input/output ports 4 and 5, reaching the position deeper than the bottom of the element isolation insulating film 2, the p-type shallow well 9 being shallower than the deep well 3. The n-type region sandwiched between the bottom of the shallow well 9 and the bottom of the deep well 3 constitutes a resistor element 8 through which current flows in a direction parallel to the substrate surface. The current input/output ports 4 and 5 are used for flowing current through the resistor element 8.

A p-type well 12 is formed in the MOS transistor region T. In an active region defined in the surface layer of the p-type well 12, an NMOS transistor 15 is formed. The NMOS transistor 15 is constituted of a source region 15S, a drain region 15D, a gate oxide film 15I, a gate electrode 15G and a channel diffusion layer 15C. In the surface layers of dummy active regions 10 in the resistor element region R, impurity diffusion layers 11 are formed in which impurity ions are implanted at the same time when impurity ions are implanted into the channel diffusion layer 15C.

As shown in FIG. 1B, the one current input/output port 4, shallow well 9 and other current input/output port 5 are disposed laterally in this order. The deep well 3 extends from the inside of the one current input/output port 4 to the inside of the other current input/output port 5 via the inside of the shallow well 9. The active regions 6 and 7 are disposed in the current input/output ports 4 and 5, respectively. The plurality of dummy active regions 10 are disposed in the shallow well 9.

As shown in FIG. 1B, although the sallow well 9 is broader than the deep well 3 along a direction (vertical direction in FIG. 1B) perpendicular to the current flow direction, the deep well 3 may be made broader than the shallow well 9. Namely, the dummy active regions 10 are not disposed in the deep well 3 outside of the shallow well 9.

With reference to FIGS. 2A to 2F, description will be made on a semiconductor device manufacture method according to the first embodiment.

Figure 2A:
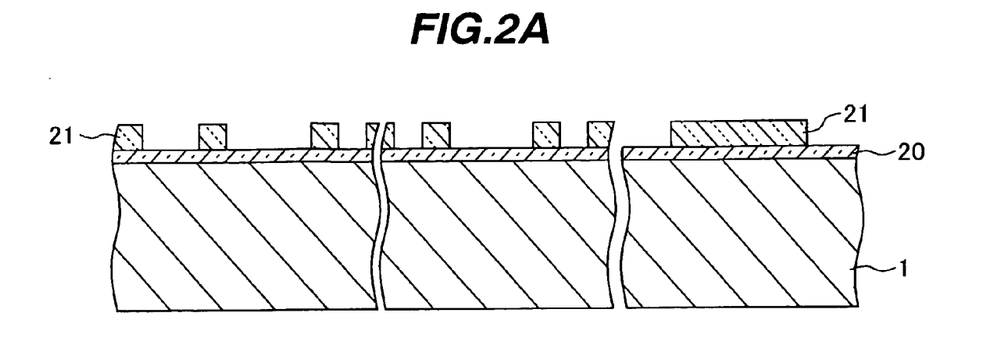
FIGS. 2A to 2F are cross sectional views of a substrate during manufacture processes, illustrating a method of manufacturing the semiconductor device according to the first embodiment.

As shown in FIG. 2A, the surface of a semiconductor substrate 1 made of p-type silicon is thermally oxidized to form a silicon oxide film 20 having a thickness of 10 nm. A mask pattern 21 made of nitride silicon and having a thickness of 115 nm is formed on the silicon oxide film 20. The mask pattern 21 is formed by forming a silicon nitride film by chemical vapor deposition (CVD) and thereafter patterning it by reactive ion etching (RIE) using $CF_4$ series gas. The mask pattern 21 covers the areas where the active regions are to be formed.

Figure 2B:
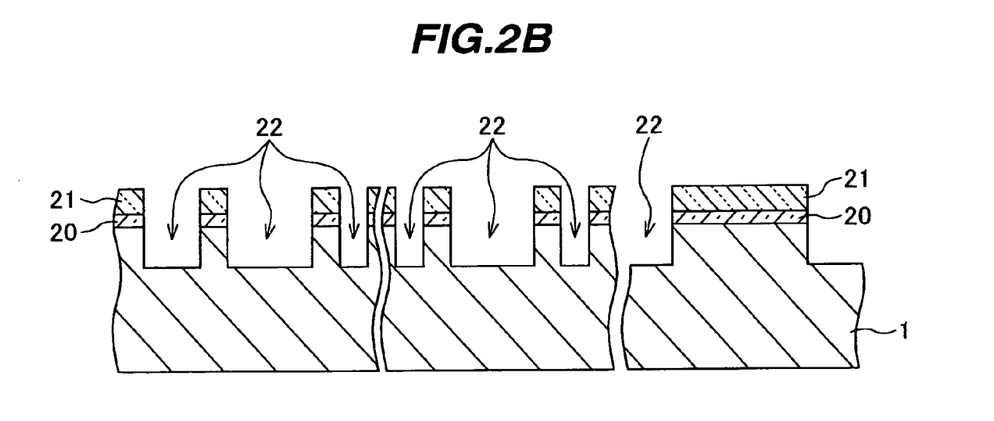

As shown in FIG. 2B, by using the mask pattern 21 as a mask, the silicon oxide film 20 and the surface layer of the semiconductor substrate 1 are etched to form a shallow trench 22 having a depth of 280 nm. Etching the semiconductor substrate 1 is performed by RIE using gas which contains HBr and $O_2$.

Figure 2C:
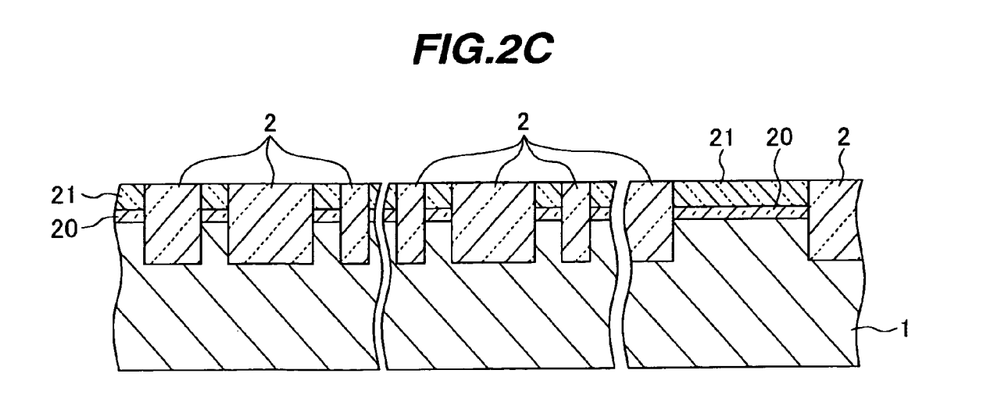

Processes up to the state shown in FIG. 2C will be described. A silicon oxide film is deposited on the semiconductor substrate 1, burying the shallow trench 22 with the silicon oxide film. The silicon oxide film is subjected to chemical mechanical polishing (CMP) until the mask pattern 21 is exposed, to thereby planarize the substrate surface. Since the dummy active regions 10 are disposed in the resistor element region R shown in FIG. 1A, the flatness is prevented from being degraded by a polishing speed difference between silicon nitride and silicon oxide. The silicon oxide film left in the shallow trench 22 becomes an element isolation insulating film 2.

The dummy active regions 10 are disposed in order to ensure the flatness of the substrate surface after CMP, and will not contribute to the electric operation of electronic circuits formed in the semiconductor substrate 1. A semiconductor active element such as a MOS transistor and a passive element such as a resistor are not formed on the surfaces of the dummy active regions 10. The whole surfaces of the active regions 10 contact an insulating film.

Figure 2D:
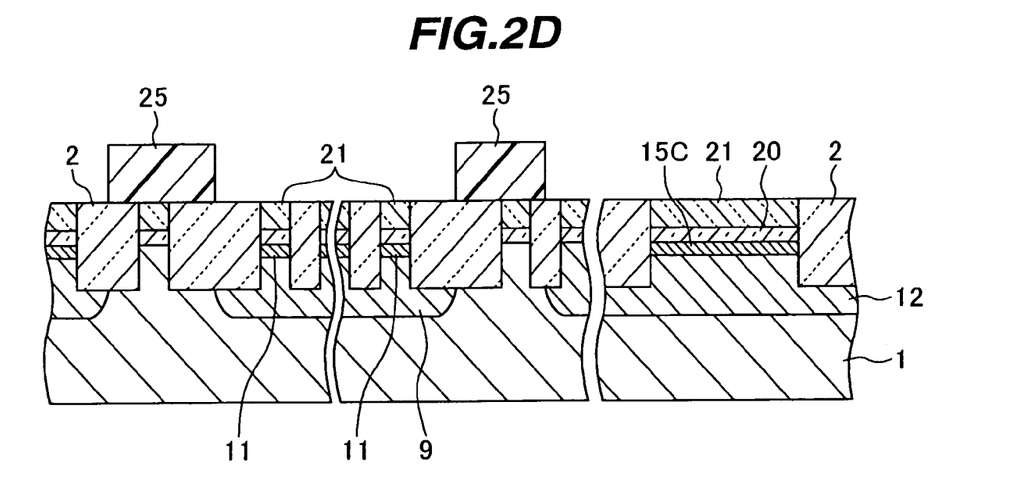

As shown in FIG. 2D, a resist pattern 25 is formed having openings in areas corresponding to the regions where the shallow well 9 and p-type well 12 are to be formed. By using the resist pattern 25 as a mask, boron ions are implanted under the conditions of an acceleration energy of 150 keV and a dose of $3 \times 10^{13} cm^{-2}$. This ion implantation forms the p-type shallow well 9 and the p-type well 12 in which an NMOS transistor is to be formed. By using the same resist pattern 25 as a mask, boron ions are implanted to adjust the channel impurity concentration of the NMOS transistor. A channel diffusion layer 15C is therefore formed in the surface layer of the p-type well 12. At the same time, an impurity diffusion layer 11 is formed in the surface layer of the shallow well 9, the impurity diffusion layer 11 having a higher boron concentration than that in the deep region. After the boron ion implantation, the resist pattern 25 is removed.

Figure 2E:
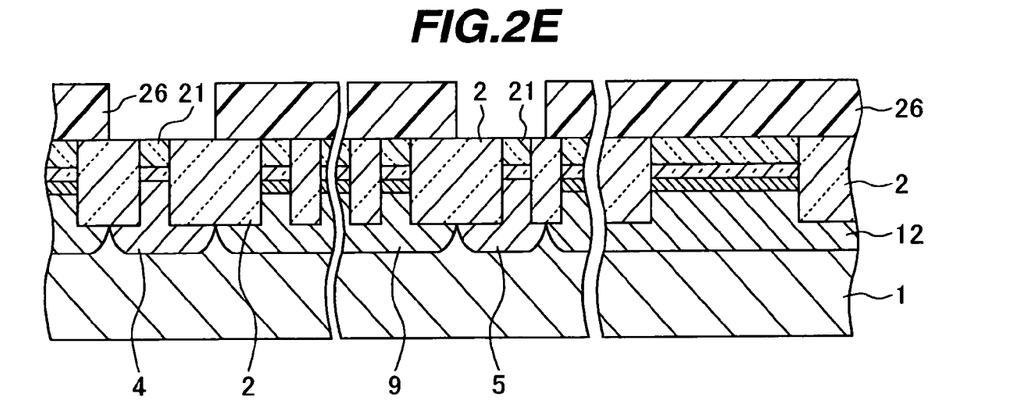

As shown in FIG. 2E, a resist pattern 26 is formed having openings in areas corresponding to the regions where the current input/output ports 4 and 5 are to be formed. By using the resist pattern 26 as a mask, phosphorus ions are implanted under the conditions of an acceleration energy of 360 keV and a dose of $3 \times 10^{13} cm^{-2}$. This ion implantation forms the current input/output ports 4 and 5 of n-type diffusion regions. At the same time, this ion implantation also forms regions in the transistor region R including an n-type well in which a PMOS transistor is to be formed. When necessary, ion implantation is performed to form the channel diffusion layer of the PMOS transistor. After phosphorus ion implantation, the resist pattern 26 is removed.

Figure 2F:
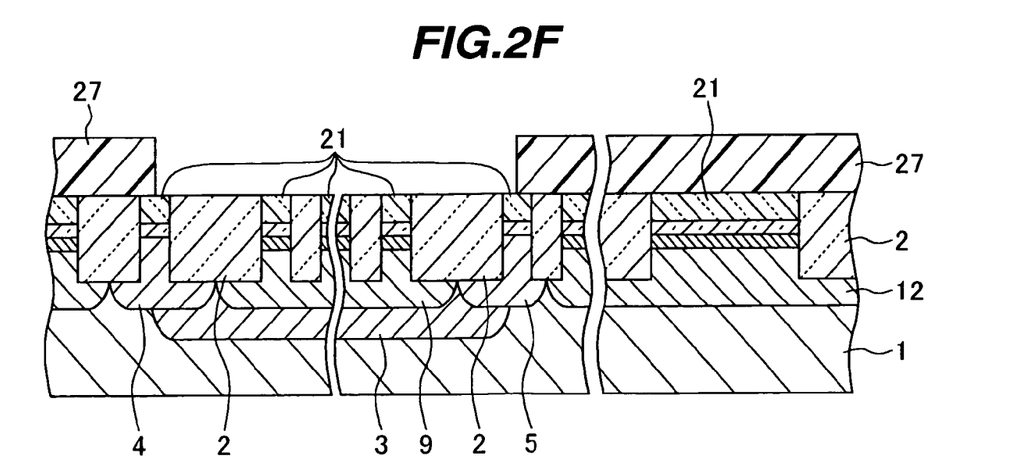

As shown in FIG. 2F, a resist pattern 27 is formed having an opening in an area corresponding to the region where the deep well 3 is to be formed. By using the resist pattern 27 as a mask, phosphorus ions are implanted under the conditions of an acceleration energy of 700 keV and a dose of $1.5 \times 10^{13} cm^{-2}$. The n-type deep well 3 is therefore formed. After the phosphorus ion implantation, the resist pattern 27 is removed. Heat treatment is then performed to activate implanted impurity ions.

The mask pattern 21 is removed by hot phosphoric acid. An NMOS transistor 15 shown in FIG. 1A is formed in the p-type well by a well-known method. During the processes of forming the NMOS transistor 15, steps at boundaries among the element isolation insulating film 2, active regions 6 and 7 and dummy active regions 10 become lower.

In the above-described first embodiment, as shown in FIG. 1A, the n-type region sandwiched between the bottom of the shallow well 9 and the bottom of the deep well 3 functions as the resistor element 8. Since current will not flow in the surface layers of the dummy active regions 10, the resistance value of the resistor element 8 will not be influenced by the distribution of the dummy active regions 10.

Further, in the first embodiment, during the ion implantation processes shown in FIGS. 2D to 2F the dummy active regions 10 are covered with the mask pattern 21, so that the channeling phenomenon can be suppressed. The substrate surface during the ion implantation processes is flat after CMP. Therefore, the impurity concentration distribution in the shallow well 9 and deep well 3 along the depth direction is generally equal in the active region under the element isolation insulating film 2 and the dummy active regions 10. It is therefore possible to form the resistor element 8 whose resistance value is independent from the pattern of the element isolation insulating film 2.

Next, with reference to FIGS. 3A to 3C, description will be made on a semiconductor device manufacture method according to the second embodiment. A semiconductor device of the second embodiment has the same structure as that of the semiconductor device of the first embodiment. In the following, the semiconductor device manufacture method will be described by paying attention to different points from the semiconductor device manufacture method of the first embodiment. The processes shown in FIGS. 2A to 2C of the first embodiment are the same as those of the second embodiment.

In the first embodiment, in the process shown in FIG. 2D, the ion implantation process for the shallow well 9 and p-type well 12 and the ion implantation process for the channel diffusion layer 15C are executed. In the second embodiment, as shown in FIG. 3A only the ion implantation process for the shallow well 9 and p-type well 12 is executed and the ion implantation process for the channel diffusion layer is not executed.

Figure 3A:
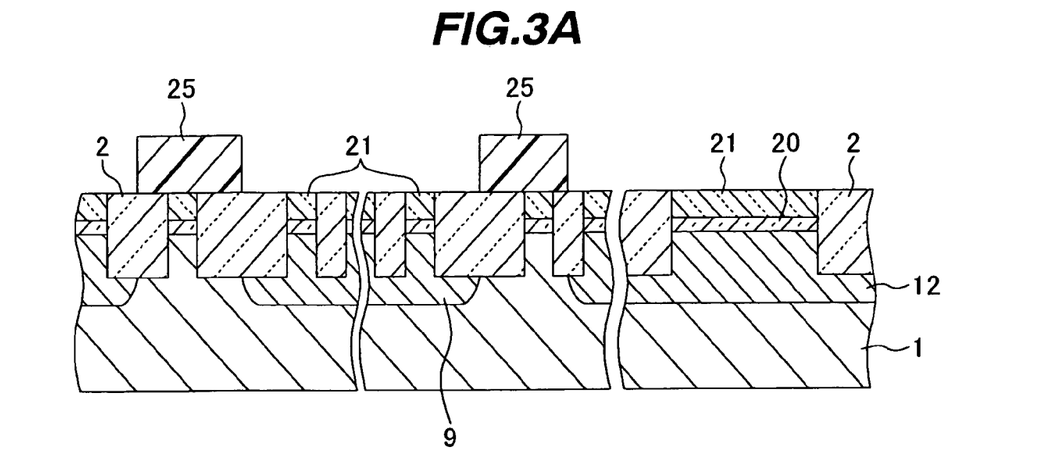
FIGS. 3A to 3C are cross sectional views of a substrate during manufacture processes, illustrating a method of manufacturing the semiconductor device according to a second embodiment.
Figure 3B:
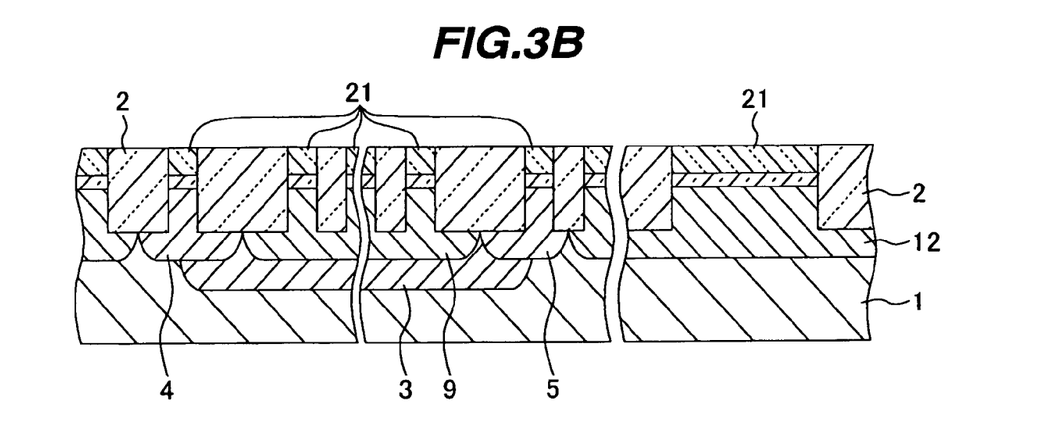

As shown in FIG. 3B, the current input/output ports 4 and 5 and the deep well 3 are formed. The method of forming these wells is similar to that of the first embodiment described with reference to FIGS. 2E and 2F. After these ion implantation processes, the mask pattern 21 is removed.

Figure 3C:
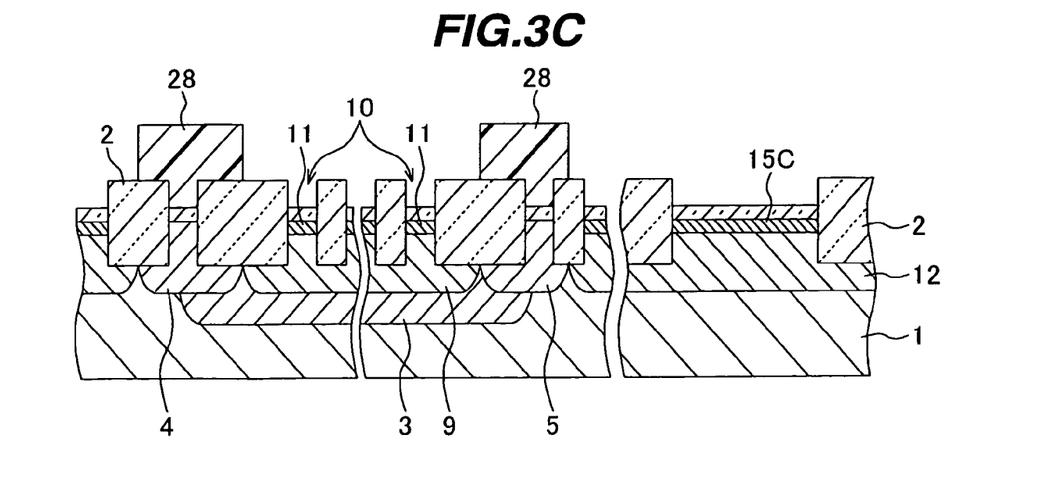

As shown in FIG. 3C, a resist pattern 28 is formed having the pattern similar to that of the resist pattern 25 shown in FIG. 3A. By using the resist pattern 28 as a mask, impurity ions are implanted to adjust the channel impurity concentration. The channel diffusion layer 15C is therefore formed in the surface layer of the p-type well 12, and the impurity diffusion layer 11 is formed in the surface layer of each dummy active region 10. After this ion implantation, the resist pattern 28 is removed and then heat treatment is performed to activate implanted impurity ions.

Similar to the first embodiment, the NMOS transistor 15 shown in FIG. 1A is formed.

The method of forming the shallow well 9 and deep well 3 of the second embodiment is similar to that of the first embodiment. It is therefore possible to form the resistor element 8 whose resistance value is independent from the pattern of the element isolation insulating film 2. Further, in the second embodiment, as shown in FIG. 3C, ion implantation for the channel diffusion layer 15C is performed without the involvement of the mask pattern 21. Therefore, the slope of the impurity concentration distribution in the channel diffusion layer along the depth direction can be made steep.

Next, with reference to FIGS. 4A and 4B, a semiconductor device according to the third embodiment will be described.

Figure 4A:
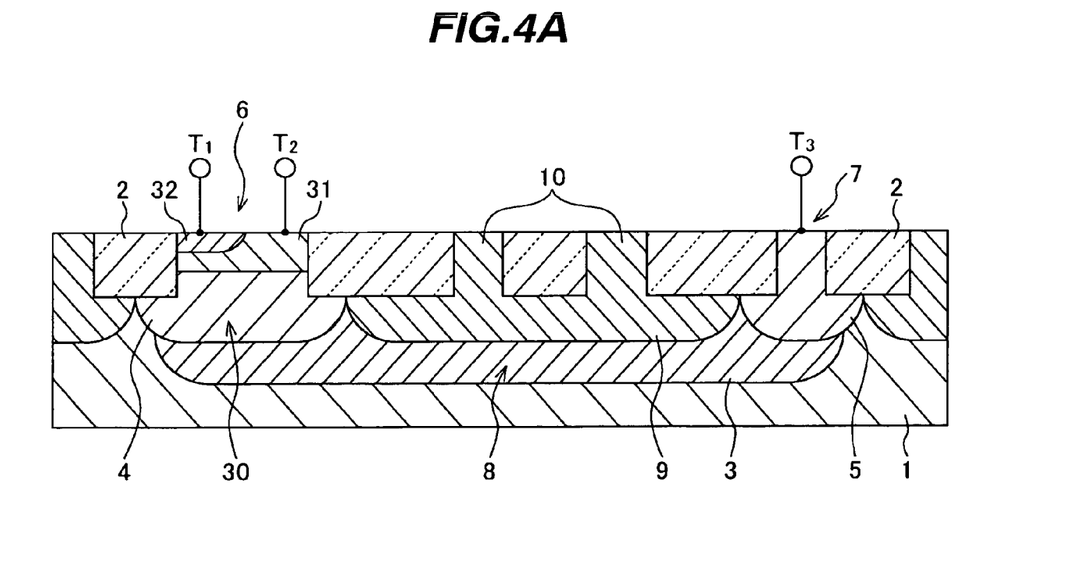
FIG. 4A is a cross sectional view of a semiconductor device according to a third embodiment.

FIG. 4A is a cross sectional view of a semiconductor device according to the third embodiment. Different points from the semiconductor device of the first embodiment shown in FIG. 1A will be described. In the first embodiment, the n-type impurity diffusion regions constituting the current input/output ports 4 and 5 are exposed on the surfaces of the active regions 6 and 7. In the third embodiment, in one active region 6, an npn bipolar transistor 30 is formed. The n-type impurity diffusion region constituting the current input/output region 4 is the collector region of the bipolar transistor 30.

A p-type base region 31 is formed in the surface layer of the current input/output port 4, and an n-type emitter region 32 is formed in a partial region of the surface layer. The n-type region between the bottom of the shallow well 9 and the bottom of the deep well 3 is the resistor element 8.

Figure 4B:
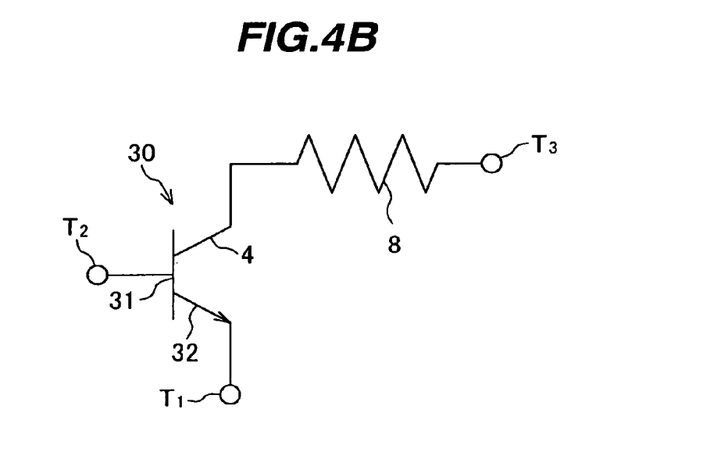
FIG. 4B is an equivalent circuit of the semiconductor device of the third embodiment.

FIG. 4B is an equivalent circuit diagram of the semiconductor device of the third embodiment. The resistor element 8 is connected to the collector 4 of the npn bipolar transistor 30 constituting a three-terminal electronic circuit having an emitter 32 and a base 31 of the bipolar transistor 30 and the other terminal of the resistor element 8 as terminals $T_1$, $T_2$ and $T_3$, respectively.

As in the case of the third embodiment, the current input/output portions 4 and 5 defined in opposite regions of the resistor element 8 may be used as a portion of another semiconductor element.

The current input/output regions 4 and 5 are not necessarily required to be the impurity diffusion regions. For example, one end of the deep well 3 shown in FIG. 1A may be exposed on the surface of the active region 7 and a conductive member electrically connected to the exposed surface may be used as the current input/output port. Examples of such a conductive member are a conductive plug filled in a via hole formed through an interlevel insulating film on a substrate, a metal silicide layer formed on the surface of the active region and the like.

In the above-described embodiments, although the resistor element 8 is of the n-type, a p-type resistor element may be formed, for example, by changing the conduction types of the deep well 3 and shallow well 9 shown in FIG. 1A to the p-type and n-type respectively.

The present invention has been described in connection with the preferred embodiments. The invention is not limited only to the above embodiments. It will be apparent to those skilled in the art that other various modifications, improvements, combinations, and the like can be made.

We claim:

1. A semiconductor device comprising:
   a first well formed in a surface layer of a semiconductor substrate, the surface layer being of a first conductivity type, the first well being of a second conductivity type opposite to the first conductivity type;
   a pair of current input/output ports connected to the first well, the pair of current input/output ports being used for flowing current through the first well along a direction parallel to a substrate surface from one of the pair of current input/output ports to the other;
   a second well of the first conductivity type disposed between the pair of current input/output ports, the second well being shallower than the first well;
   an element isolation insulating film buried in a trench formed in a surface layer of the semiconductor substrate and defining a dummy active region between the pair of current input/output ports, the dummy active region being surrounded by the element isolation insulating film; and
   an electric circuit formed in the semiconductor substrate, the electric circuit comprising the first well as an electric resistance;
   wherein the second well reaches a position deeper than a bottom of the element isolation insulating film, and
   wherein the dummy active region is not conductively connected to any electric circuit formed in the semiconductor substrate.

2. The semiconductor device according to claim 1, wherein each of the pair of current input/output ports consists of an impurity diffusion region of the second conductivity type, the impurity diffusion region at least partially overlapping the first well.

3. The semiconductor device according to claim 2, wherein each of the pair of current input/output ports contacts the second well.

4. The semiconductor device according to claim 1, wherein each of the pair of current input/output ports consists of an impurity diffusion region of the second conductivity type, the impurity diffusion region at least partially overlapping the first well.

5. The semiconductor device according to claim 4, wherein each of the pair of current input/output ports contacts the second well.

6. The semiconductor device according to claim 1, wherein said pair of current input/output ports are the only current connections to said first and second well.

7. The semiconductor device according to claim 1, wherein said electric circuit comprises an npn bipolar transistor.

8. A semiconductor device comprising a resistor, said resistor comprising:
   a first well formed in a surface layer of a semiconductor substrate, the surface layer being of a first conductivity type, the first well being of a second conductivity type opposite to the first conductivity type;
   a pair of current input/output ports connected to the first well, the pair of current input/output ports being used for flowing current through the first well along a direction parallel to a substrate surface;
   a second well of the first conductivity type disposed between the pair of current input/output ports, the second well being shallower than the first well;
   an element isolation insulating film buried in a trench formed in a surface layer of the semiconductor substrate and defining a dummy active region between the pair of current input/output ports, the dummy active region being surrounded by the element isolation insulating film;
   wherein the second well reaches a position deeper than a bottom of the element isolation insulating film, and
   wherein the dummy active region is not conductively connected to any electric circuit formed in the semiconductor substrate.

9. A semiconductor device comprising:
   a first well formed in a surface layer of a semiconductor substrate, the surface layer being of a first conductivity type, the first well being of a second conductivity type opposite to the first conductivity type;
   a pair of current input/output ports connected to the first well, the pair of current input/output ports being used for flowing current through the first well along a direction parallel to a substrate surface from one of the pair of current input/output ports to the other;
   a second well of the first conductivity type disposed between the pair of current input/output ports, the second well being shallower than the first well;
   an element isolation insulating film buried in a trench formed in a surface layer of the semiconductor substrate and defining a dummy active region between the pair of current input/output ports, the dummy active region being surrounded by the element isolation insulating film;

a first terminal electrically connected to one of the current input/output ports, a first voltage being applied to the first terminal; and a second terminal electrically connected to the other of the current input/output ports, a second voltage different from the first voltage being applied to the second terminal, wherein the second well reaches a position deeper than a bottom of the element isolation insulating film, and wherein the dummy active region is not conductively connected to any electric circuit formed in the semiconductor substrate.

* * * * *